US012707933B2

(12) United States Patent
Hammond et al.

(10) Patent No.: US 12,707,933 B2
(45) Date of Patent: Aug. 11, 2026

(54) SEMICONDUCTOR SUBSTRATE CHUCKING SENSOR

(71) Applicant: Applied Materials, Inc., Santa Clara, CA (US)

(72) Inventors: Edward P. Hammond, Hillsborough, CA (US); Tsutomu Tanaka, Santa Clara, CA (US); Alexander V. Garachtchenko, Brentwood, CA (US); Dmitry A Dzilno, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 182 days.

(21) Appl. No.: 18/429,103

(22) Filed: Jan. 31, 2024

(65) Prior Publication Data

US 2025/0246470 A1 Jul. 31, 2025

(51) Int. Cl.

*H10P 72/72* (2026.01)
*H01L 21/683* (2006.01)
*H10P 72/00* (2026.01)

(52) U.S. Cl.

CPC ........ *H10P 72/722* (2026.01); *H10P 72/0604* (2026.01)

(58) Field of Classification Search

CPC ........... H01L 21/6833; H01L 21/67253; H10P 72/722

See application file for complete search history.

(56) References Cited

U.S. PATENT DOCUMENTS

| | | | | |
|---|---|---|---|---|
| 6,074,488 | A | 6/2000 | Roderick et al. | |
| 2004/0188021 | A1 | 9/2004 | Mitrovic | |
| 2009/0159439 | A1 | 6/2009 | Pipitone et al. | |
| 2017/0040198 | A1* | 2/2017 | Lin | H01J 37/32715 |
| 2018/0138015 | A1* | 5/2018 | Ghantasala | H01J 37/32082 |
| 2020/0249263 | A1 | 8/2020 | Xu et al. | |
| 2021/0391141 | A1* | 12/2021 | Baker | H01J 37/32935 |

FOREIGN PATENT DOCUMENTS

KR 101161125 B1 6/2012

OTHER PUBLICATIONS

International Application No. PCT/US2025/012648, International Search Report and Written Opinion mailed on May 8, 2025, 11 pages.

* cited by examiner

*Primary Examiner* — Scott Bauer
(74) *Attorney, Agent, or Firm* — Kilpatrick Townsend & Stockton LLP

(57) ABSTRACT

A pedestal may be configured to support a substrate during a semiconductor process. An electrostatic chuck (ESC) may include electrodes embedded in the pedestal that are configured to deliver a chucking voltage to the pedestal during the semiconductor process. A power source coupled to an electrode may be configured to provide a signal having a frequency range to the electrode during the semiconductor process. A controller may be configured to receive a measurement of an impedance when the frequency range is applied to the electrode. The impedance measurements my then be used to determine a chucking state of the substrate, such as whether an airgap is present between the substrate and the pedestal during the semiconductor process.

20 Claims, 8 Drawing Sheets

SEMICONDUCTOR SUBSTRATE CHUCKING SENSOR

TECHNICAL FIELD

This disclosure generally describes methods and systems for detecting wafer flatness induced by electrostatic chucking devices in semiconductor processing chambers. More specifically, this disclosure describes techniques for injecting a signal with a frequency range into a pedestal electrode and measuring the resulting impedance to identify a chucking state of a substrate.

BACKGROUND

Electrostatic chucks (ESCs) play a crucial role in semiconductor processing chambers, where precision and control are paramount. These innovative devices are designed to securely hold delicate semiconductor wafers in place during various stages of the manufacturing process. Unlike traditional mechanical clamps, ESCs utilize the principles of electrostatic attraction to immobilize the wafer without any physical contact. This contactless grip minimizes the risk of damage to the wafer's surface, ensuring the integrity of the semiconductor material. By generating an electrostatic field between the chuck and the wafer, ESCs create a hold that prevents wafer movement and maintains a flat wafer profile. This precision is crucial in semiconductor manufacturing, where even minor misalignments can lead to defects and reduced yield. ESCs are equipped with electrodes that can be controlled to allow for fine-tuning of the electrostatic forces acting on different parts of the wafer.

SUMMARY

In some embodiments, a semiconductor processing chamber may include a pedestal configured to support a substrate during a semiconductor process. The chamber may also include an electrostatic chuck (ESC) that may include one or more electrodes embedded in the pedestal. The one or more electrodes may be configured to deliver a chucking voltage to the pedestal during the semiconductor process. The chamber may additionally include a power source coupled to an electrode in the one or more electrodes. The power source may be configured to provide a signal having a frequency range to the electrode during the semiconductor process. The chamber may further include a controller that may be configured to receive a measurement of an impedance when the signal having the frequency range is applied to the electrode. The controller may also be configured to determine a chucking state of the substrate, such as whether an airgap is present between the substrate and the pedestal during the semiconductor process based at least in part on the impedance.

In some embodiments, a method of monitoring substrate chucking during semiconductor processes may include applying a direct-current (DC) chucking voltage to one or more electrodes embedded in a pedestal that is configured to support a substrate during a semiconductor process. The method may also include applying a signal to an electrode in the one or more electrodes during the semiconductor process, where the signal may have a frequency range. The method may additionally include measuring an impedance when the signal having the frequency range is applied to the electrode. The method may further include determining a chucking state of the substrate relative to the pedestal during the semiconductor process based at least in part on the impedance.

In some embodiments, one or more non-transitory computer-readable media may include instructions that, when executed by one or more processors, cause the one or more processors to perform operations including causing a direct-current (DC) chucking voltage to be applied to one or more electrodes embedded in a pedestal that is configured to support a substrate during a semiconductor process. The operations may also include causing a signal to be applied to an electrode in the one or more electrodes during the semiconductor process, where the signal may have a frequency range. The operations may additionally include receiving a measurement of an impedance when the signal having a frequency range is applied to the electrode. The operations may further include determining a chucking state of the substrate relative to the pedestal during the semiconductor process based at least in part on the impedance.

In any embodiments, any and all of the following features may be implemented in any combination and without limitation. The impedance may include an input impedance measured between an output of the power source and a ground. The power source may include a measurement circuit configured to measure the input impedance. The one or more electrodes may include a single electrode for a monopolar ESC. A filter on an output of the power source may be configured to filter a radio-frequency (RF) signal provided to a plasma in the semiconductor processing chamber during the semiconductor process. The one or more electrodes may include two electrodes for a bipolar ESC. The bipolar ESC may include a top-feed for RF power, with the powered electrode at the top, and the bottom electrodes in the pedestal may be coupled to ground while providing the ESC voltage to the substrate. The bipolar ESC may include a bottom-feed for RF power, with the powered electrodes at the bottom, and the electrode in the pedestal may be coupled to an RF power supply configured to provide an RF signal to the electrode during the semiconductor process, while providing the ESC voltage to the substrate. Applying the signal having the frequency range may include applying an alternating-current (AC) signal that sweeps the frequency range between a first frequency and a second frequency, where the first frequency may be less than the second frequency. The frequency range may be between about 1 kHz and about 1 MHz. The impedance being less than a first impedance may indicate that the substrate is not fully chucked, and the impedance being greater than a second impedance may indicate that the substrate is fully chucked. A resonant range may be identified in the frequency range, where the resonant range may be between a local minimum and a local maximum observed in the measurement of the impedance. After identifying the resonant range, the signal may be applied to the electrode by sweeping frequencies within the resonant range. After identifying a frequency in the resonant range, the signal may be applied to the electrode at the frequency instead of sweeping frequencies throughout the resonant range. The method/operations may also include determining an impedance that indicates a fully chucked substrate by applying a sufficient chucking voltage to the electrode when the substrate is on the pedestal and measuring the impedance; and determining an impedance that indicates an absent substrate by measuring the impedance when the substrate is not on the pedestal; and determining an impedance that indicates an un-chucked substrate by measuring the impedance when the substrate is on the pedestal but without an ESC voltage applied. The DC chucking voltage may be gradually ramped up until the impedance indicates that the substrate is fully chucked to the pedestal. The DC chucking voltage may be gradually ramped down until the impedance indicates that the substrate is not fully chucked to the pedestal, and then the DC chucking voltage may be incrementally increased until the impedance again indicates that the substrate is fully chucked to the pedestal.

BRIEF DESCRIPTION OF THE DRAWINGS

A further understanding of the nature and advantages of various embodiments may be realized by reference to the remaining portions of the specification and the drawings, wherein like reference numerals are used throughout the several drawings to refer to similar components. In some instances, a sub-label is associated with a reference numeral to denote one of multiple similar components. When reference is made to a reference numeral without specification to an existing sub-label, it is intended to refer to all such multiple similar components.

DETAILED DESCRIPTION

Semiconductor processes rely on properly holding a substrate against the pedestal using electrostatic chuck. However, it is difficult to identify an optimal chucking voltage for each different processing chamber, substrate, and/or semiconductor process. These embodiments provide techniques for determining a chucking state of the substrate in situ during a semiconductor process. A signal that sweeps through a frequency range may be provided to the electrostatic chuck during the process. If the substrate is not fully chucked, an air gap may exist between the substrate and the pedestal. At certain frequencies, the air gap may greatly affect the impedance between the substrate and the ESC electrode. This may result in a measurable change in the impedance into the pedestal. This change in impedance may be monitored in real time, and an impedance shift can be observed as the chucking voltage is adjusted. When the impedance reaches a predetermined value, the applied chucking voltage may be considered an optimal voltage to chuck the substrate to the pedestal adequately without applying more voltage than is necessary.

After describing general aspects of a chamber according to some embodiments of the present technology in which plasma processing operations discussed below may be performed, specific methodology may be discussed. It is to be understood that the present technology is not intended to be limited to the specific films, chambers or processes discussed, as the techniques described may be used to improve a number of film formation processes, and may be applicable to a variety of processing chambers and operations.

Figure 1:
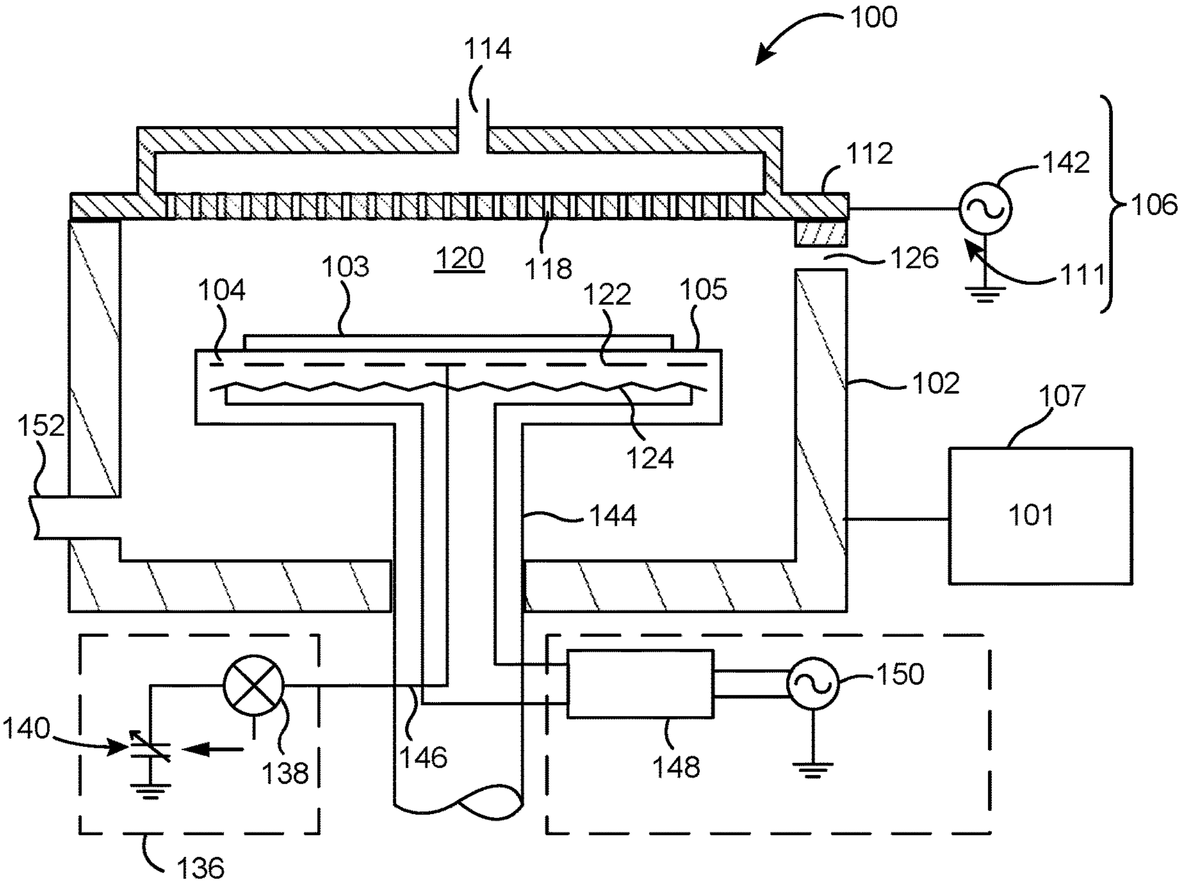
FIG. 1 shows a schematic cross-sectional view of an exemplary processing chamber, according to some embodiments.

FIG. 1 shows a cross-sectional view of an exemplary processing chamber 100, according to some embodiments. The figure may illustrate an overview of a system incorporating one or more aspects of the present technology, and/or which may be specifically configured to perform one or more operations according to embodiments of the present technology. Additional details of chamber 100 or methods performed may be described further below. Chamber 100 may be utilized to form film layers, etch material layers, form other material layers, or a combination thereof, although it is to be understood that deposition and etch methods may similarly be performed in any chamber within which deposition and etch processes may occur. The processing chamber 100 may include a chamber body 102, a substrate support 104 disposed inside the chamber body 102, and a lid assembly 106 coupled with the chamber body 102 and enclosing the substrate support 104 in a processing volume 120. A substrate 103 may be provided to the processing volume 120 through an opening 126, which may be conventionally sealed for processing using a slit valve or door. The substrate 103 may be seated on a surface 105 of the substrate support during processing. In some embodiments, the substrate support 104 may be rotatable, along a vertical axis, where a shaft 144 of the substrate support 104 may be located, or may be stationary. Alternatively, the substrate support 104 may be lifted up to rotate as necessary during a deposition process.

A gas distributor 112 may define apertures 118 for distributing process precursors into the processing volume 120. The gas distributor 112 may be coupled with a first source of electric power 142, such as an RF generator, RF power source, DC power source, pulsed DC power source, pulsed RF power source, or any other power source that may be coupled with the processing chamber, provided that the distributor is electrically isolated from the grounded chamber body. In some embodiments, the first source of electric power 142 may be an RF power source.

The gas distributor 112 may be a conductive gas distributor or a non-conductive gas distributor. The gas distributor 112 may also be formed of conductive and non-conductive components. For example, a body of the gas distributor 112 may be conductive while a face plate of the gas distributor 112 may be non-conductive. The gas distributor 112 may be powered, such as by the first source of electric power 142 as shown in FIG. 1, or the gas distributor 112 may be coupled with ground in some embodiments.

A first electrode 122 may be coupled with the substrate support 104. The first electrode 122 may be embedded within the substrate support 104 or coupled with a surface of the substrate support 104. The first electrode 122 may be a plate, a perforated plate, a mesh, a wire screen, or any other distributed arrangement of conductive elements. The first electrode 122 may be a tuning electrode and may be coupled with a tuning circuit 136 by a conduit 146, for example a cable having a selected resistance, such as 50 ohms, for example, disposed in the shaft 144 of the substrate support 104. The tuning circuit 136 may have an electronic sensor 138 and an electronic controller 140, which may be a variable capacitor. The electronic sensor 138 may be a voltage or current sensor and may be coupled with the electronic controller 140 to provide further control over plasma conditions in the processing volume 120.

A second electrode 124, which may be a bias electrode and/or an electrostatic chucking electrode, may be coupled with the substrate support 104. The second electrode may be coupled with a second source of electric power 150 through a filter 148, which may be an impedance matching circuit. The second source of electric power 150 may be DC power, pulsed DC power, RF bias power, a pulsed RF source or bias power, or a combination of these or other power sources. In some embodiments, the second source of electric power 150 may be an RF bias power. The substrate support 104 may also include one or more heating elements configured to heat the substrate to a processing temperature, which may be between about 25° C. and about 800° C. or greater.

The lid assembly 106 and substrate support 104 of FIG. 1 may be used with any processing chamber for plasma or thermal processing. In operation, the processing chamber 100 may afford real-time control of plasma conditions in the processing volume 120, such as via a controller 101 which may be contained within a processor 107. The substrate 103 may be disposed on the substrate support 104, and process gases may be flowed through the lid assembly 106 using an inlet 114 according to any desired flow plan. Gases may exit the processing chamber 100 through an outlet 152. Electric power may be coupled with the gas distributor 112 to establish a plasma in the processing volume 120. The substrate may be subjected to an electrical bias using the second electrode 124 in some embodiments.

Upon energizing a plasma in the processing volume 120, a potential difference may be established between the plasma and the first electrode 122. The electronic controller 140 may then be used to adjust the flow properties of the ground paths represented by the tuning circuit 136. A set point may be delivered to the tuning circuit 136 to provide independent control of deposition rate and of plasma density uniformity from center to edge. In embodiments where the electronic controllers may both be variable capacitors, the electronic sensors may adjust the variable capacitors to maximize deposition rate and minimize thickness non-uniformity independently.

Tuning circuit 136 may have a variable impedance that may be adjusted using the electronic controller 140. Where the electronic controller 140 is a variable capacitor, the capacitance range of each of the variable capacitors, may be chosen to provide an impedance range. This range may depend on the frequency and voltage characteristics of the plasma, which may have a minimum in the capacitance range of each variable capacitor. Hence, when the capacitance of the electronic controller 140 is at a minimum or maximum, impedance of the tuning circuit 136 may be high, resulting in a plasma shape that has a minimum aerial or lateral coverage over the substrate support. When the capacitance of the electronic controller 140 approaches a value that minimizes the impedance of the tuning circuit 136, the aerial coverage of the plasma may grow to a maximum, effectively covering the entire working area of the substrate support 104. As the capacitance of the electronic controller 140 deviates from the minimum impedance setting, the plasma shape may shrink from the chamber walls and aerial coverage of the substrate support may decline.

The electronic sensor 138 may be used to tune the tuning circuit 136 in a closed loop. A set point for current or voltage, depending on the type of sensor used, may be installed in each sensor, and the sensor may be provided with control software that determines an adjustment to the electronic controller 140 to minimize deviation from the set point. Consequently, a plasma shape may be selected and dynamically controlled during processing. It is to be understood that, while the foregoing discussion is based on electronic controller 140, which may be a variable capacitor, any electronic component with adjustable characteristic may be used to provide tuning circuit 136 with adjustable impedance.

Processing chamber 100 may be utilized in some embodiments of the present technology for processing methods that may include bottom-up deposition of materials for semiconductor structures. It is to be understood that the chamber described is not to be considered limiting, and any chamber that may be configured to perform operations as described may be similarly used.

Semiconductor processes performed on semiconductor substrates rely on the substrate being completely chucked to the pedestal during the semiconductor process. When fully chucked, the substrate is prevented from moving on the pedestal during the process. The substrate is also held flat against the pedestal, which may correct for bowing or warpage that may have previously been induced in the substrate. If the substrate is not fully chucked against the pedestal, the horizontal profile of the substrate may vary from the center to the edge of the substrate, thereby causing inconsistent results of the semiconductor process (e.g., varying film thicknesses, varying etch depths, varying fill heights, and so forth). Additionally, a substrate that is not fully chucked against the pedestal may result in an air gap between the substrate and the pedestal, thereby allowing the backside of the substrate to possibly be affected by the semiconductor process. An un-chucked substrate may also move on the pedestal, resulting in scratches or other damage to the backside of the substrate. Conversely, if the applied chucking voltage is too great, the force applied to the substrate may damage the substrate. For example, over-chucking the substrate may resulting cracks or shattering of the substrate. Applying an optimal chucking voltage that adequately holds the substrate flat against the pedestal while not applying too much force that could damage the substrate represents a technical problem affecting many processing chambers.

Since the conditions in each processing chamber and the characteristics of each substrate may vary greatly across any semiconductor process, the optimal chucking voltage needs to be determined for each individual processing chamber, semiconductor process, and/or semiconductor substrate. For example, the position of the substrate, the flatness of the substrate, the temperature of the process, and/or other characteristics may affect the optimal chucking voltage. Since a uniform chucking voltage often cannot be applied uniformly across numerous substrates and processing chambers, current techniques utilize a trial-and-error approach of adjusting the chucking voltage until the substrate is properly chucked. Complicating matters further, adequately assessing the chucking state of the substrate during the semiconductor process is very difficult without affecting the process itself. Therefore, a determination as to whether the substrate was properly chucked is often made after the process is complete based on the results. Existing in situ measurement techniques cannot be universally used in all processes and substrates. For example, backside helium flow may be used in very low pressure processes, but this technique is not practical at the pressures required for most plasma-enhanced chemical vapor deposition (PECVD) processes.

The embodiments described herein solve these and other technical problems to determine a chucking state of the substrate in situ during a semiconductor process being performed. A signal at a certain frequency or frequency range may be provided to the ESC during the process. If the substrate is not fully chucked, an air gap may exist between the substrate and the pedestal. The air gap may greatly affect the impedance between the substrate and the ESC electrode. This may result in a measurable change in the power reflected back to the signal source and/or the input impedance to the pedestal. This change in impedance may be monitored in real time, and an impedance shift can be observed as the chucking voltage is adjusted. When the impedance reaches a predetermined value the applied chucking voltage may be considered an optimal voltage to chuck the substrate to the pedestal adequately without applying more voltage than is necessary.

Figure 2:
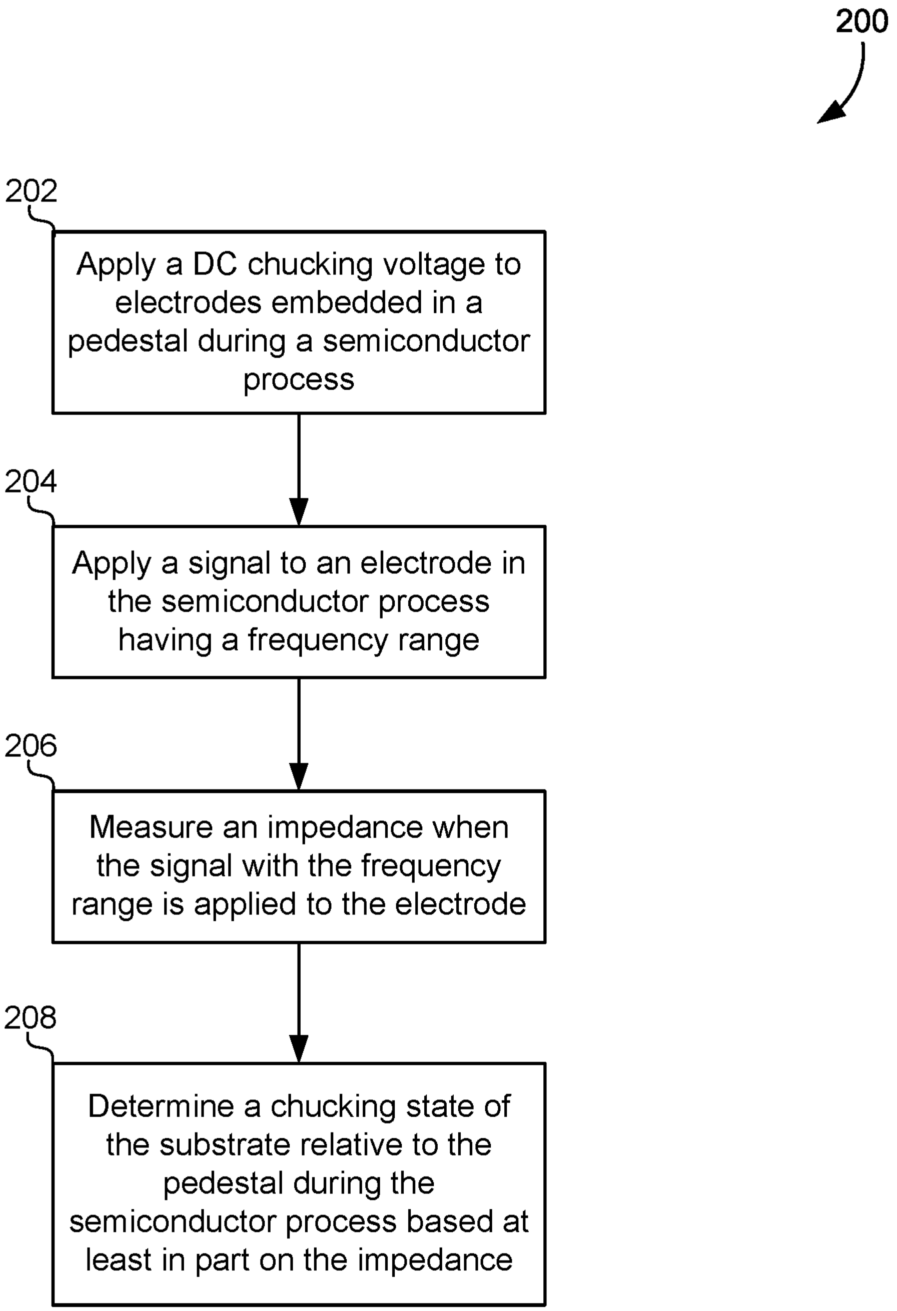
FIG. 2 illustrates a flowchart of a method for monitoring substrate chucking during semiconductor processes, according to some embodiments.

FIG. 2 illustrates a flowchart of a method 200 for monitoring substrate chucking during semiconductor processes, according to some embodiments. This method may be executed by a controller, such as the controller 101 illustrated in FIG. 1. The controller 101 may include one or more processors and one or more non-transitory computer-readable media that store instructions. These instructions may cause the one or more processors to perform the operations described in detail below. For example, the controller 101 may be implemented using a computer system, such as the computer system 800 described below in FIG. 8. The controller 101 may additionally be configured to control the operations of the processing chamber 100. For example, the controller 101 may cause different operating characteristics of the processing chamber to change during the semiconductor process based on a "recipe." Executing the recipe may allow the controller 101 to cause environmental and other conditions to change within the processing chamber. For example, the recipe may adjust temperatures, pressures, gas flows, gas species, chucking voltages, RF signals, plasma conditions, pedestal locations, and/or any other aspect of the processing chamber 100 as the semiconductor process is executed. The one or more processors may also be distributed between the controller 101 as an integrated controller of the processing chamber 100 and between other computer systems, such as a local server, a cloud-based server, a tool or platform controller, or any other computer system.

The method may include applying a direct-current (DC) chucking voltage to one or more electrodes embedded in a pedestal that is configured to support a substrate during a semiconductor process (202). The DC chucking voltage may represent an initial chucking voltage that will be applied to the substrate at the beginning of the semiconductor process. As described below, this DC chucking voltage may be adjusted in response to impedance measurements to determine a chucking state of the substrate. The following simplified schematics of the processing chamber further illustrate hardware components that may be used to execute the operations of this method. However, the following figures are provided only by way of example and are not meant to be limiting. These techniques may be applicable to many different hardware configurations and processing chamber designs.

Figure 3:
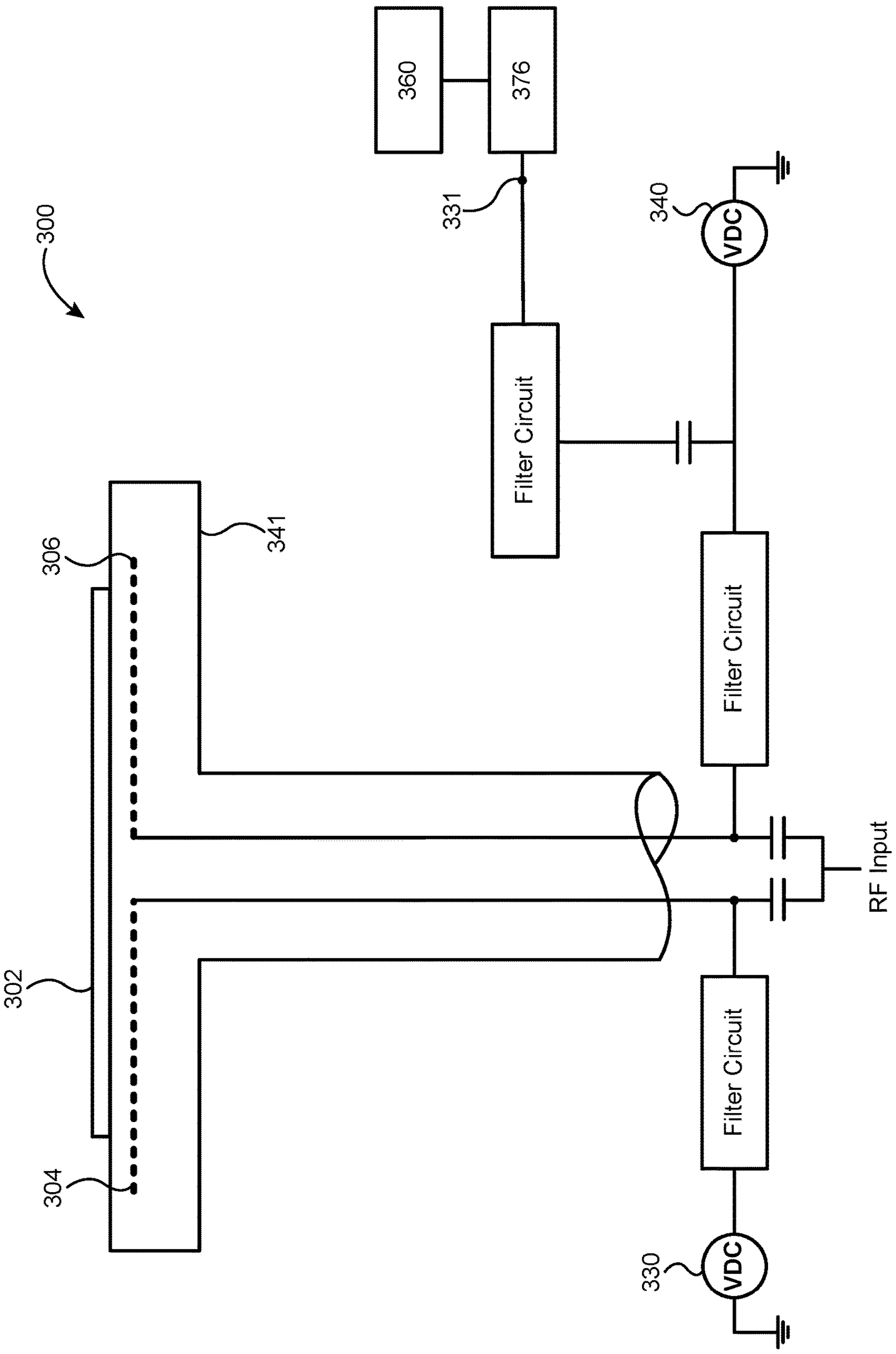
FIG. 3 illustrates a processing chamber configured to perform the in situ determination of a substrate chucking state with a bipolar ESC in a bottom-drive configuration, according to some embodiments.

FIG. 3 illustrates a processing chamber 300 configured to perform the in situ determination of a substrate chucking state, according to some embodiments. The processing chamber 300 may be a more specific example of a portion of the processing chamber 100 illustrated in FIG. 1. The processing chamber 300 may include a pedestal 341 that is configured to support a substrate 302 during a semiconductor process. The semiconductor process may include any type of semiconductor process, including etch processes, deposition processes, plasma-enhanced processes, and so forth. This embodiment includes a bottom-feed system where the RF input is provided to the pedestal. The same configuration may also be used with a top-feed system where the RF input depicted in FIG. 3 is replaced with an RF ground.

The processing chamber 300 may include an ESC for applying a chucking voltage to the substrate 302. In this example, the ESC may be implemented as a bipolar ESC, where different voltages are applied to different electrodes in the pedestal 341. Generally, the pedestal 341 may include one or more electrodes. For a bipolar chuck, this may include two electrodes embedded in the pedestal 341. For example, the pedestal 341 may include a first electrode 304 and a second electrode 306. These electrodes may be implemented with any type of conductive material, such as a wire mesh. These electrodes may be embedded at a distance within the pedestal 341. When opposing chucking voltages are applied to these electrodes, an electrostatic force is generated that attracts the substrate 302 to the surface of the pedestal 341.

The ESC may include one or more voltage sources. The sources may also be referred to as ESC sources or DC voltage sources. For example, the processing chamber 300 may include a first DC voltage source 330 and a second DC voltage source 340. These DC voltage sources may be configured to apply approximately equal and opposite DC voltages to the ESC electrodes in the pedestal 341. For example, the first DC voltage source 330 may apply a relatively large negative voltage to the first electrode 304, and the second DC voltage source 340 may apply a relatively large positive voltage to the second electrode 306. The negative voltage and the positive voltage may be approximately equal. The controller may be configured to dynamically control the magnitude of the positive and negative DC voltages applied by these DC voltage sources. As described below, the controller may adjust these voltage sources up/down to initially determine an optimal chucking voltage and to characterize or identify different chucking states of the substrate 302.

The method 200 may also include applying a signal to an electrode in the one or more electrodes during the semiconductor process (204). In order to determine the chucking state of the substrate in situ during a semiconductor process, a signal at a certain frequency or range of frequencies may be injected into one of the DC chucking circuits. The input impedance of this signal may be monitored to detect variations in the impedance. This impedance may vary based on the chucking state of the wafer. For example, some embodiments may identify a shift and a resonant portion of the impedance spectrum at frequencies that are most sensitive to the change in capacitance due to the chucking state of the substrate. These techniques are described in greater detail below.

In the example of FIG. 3, the signal may be applied from a power source 376. The power source 376 may be configured to generate a relatively low-power signal having a frequency range. For example, the signal may include a sweep of frequencies within the frequency range. Therefore, the power source 376 may include a programmable power source, a function generator, and/or other similar device configured to generate a signal having a variable frequency over time. The power source 376 may be controlled by a controller 360, which may be implemented as the controller 101 from FIG. 1 or the computer system 800 of FIG. 8 described below.

The signal from the power source 376 may be coupled to one of the DC voltage inputs for the ESC. In this example, the signal may share an input to the pedestal 341 with the second DC voltage source 340. This applies the signal with the frequency range to the second electrode 306. When the signal is applied to the second electrode 306 without the substrate 302 present on the pedestal 341, there will still be a nominal amount of capacitance between the second electrode 306 and the first electrode 304.

In contrast, when the signal is applied to the second electrode 306 with the substrate 302 present on the pedestal, the substrate 302 will introduce more capacitance between the electrodes. Note that the exact capacitance range corresponding to a fully chucked substrate may vary for different embodiments based on the physical characteristics of the pedestal 341 and/or the substrate 302. As described below, certain techniques may be used to identify specific impedances indicating a fully chucked substrate and/or an unchucked substrate.

In order to identify the resulting impedance changes, the signal having the frequency range may be applied as an alternating-current (AC) signal that sweeps the frequency range between a minimum (first) frequency and a maximum (second) frequency (i.e., where the first frequency is less than the second frequency). This frequency range may be relatively low compared to the frequencies of the RF signal used to power a plasma in the processing chamber 300. In some embodiments, the frequency range may be between about 1 kHz and about 1 MHz. For example, the frequency range may be between about 1 kHz about 100 kHz, between about 100 kHz and about 200 kHz, between about 200 kHz and about 300 kHz, between about 300 kHz about 400 kHz, between about 400 kHz about 500 kHz, between about 500 kHz about 600 kHz, between about 600 kHz and about 700 kHz, between about 700 kHz and about 800 kHz, between about 800 kHz and about 900 kHz, and/or between about 900 kHz and about 1 MHz. The frequency range may also include any combination of frequency ranges described above (e.g., between about 200 kHz and about 800 kHz). Other specific ranges may include between about 50 kHz and about 110 kHz, between about 30 kHz and about 50 kHz, between about 150 kHz and about 250 kHz, and so forth. The signal may also be applied using any individual frequency in the ranges described above (e.g., about 30 kHz, about 50 kHz, about 110 kHz, about 150 kHz, about 250 kHz, about 350 kHz, and so forth).

The method 200 may further include measuring an impedance when the signal having the frequency range is applied to the electrode (206). The impedance may be measured as an input impedance to the pedestal observed from the power source 376, such as at node 331. For example, an impedance measurement circuit may be included at the output of the power source 376. In some embodiments, the power source 376 may include integrated circuitry that measures reflected power and/or input impedance. For example, instead of attempting to measure directly a capacitance change induced by the presence of the substrate 302, these embodiments may measure the impedance at the point where the signal with the frequency range is injected. The chucking state of the substrate 302 may then be characterized based on the change in measured impedance as the frequency sweeps within the frequency range. Additionally, the impedance change may also represent additional characteristics of the chamber and/or chucking state of the substrate in addition to the various capacitances in the pedestal 341.

FIG. 3 uses a bipolar ESC that may be configured in either a top-drive or bottom-drive configuration. For example, in a bottom-drive configuration a relatively high-power RF source may be applied to electrodes in the pedestal 341 in order to drive the plasma in the processing region of the processing chamber 300. The showerhead or lid assembly of the processing chamber 300 may include a ground termination that completes the conductive path of the RF power through the plasma. Alternatively, in a top-drive configuration, the RF power may be provided to the plasma through the showerhead or lid assembly of the processing chamber 300. To complete the conductive path for the RF power through the plasma, the one or more electrodes in the pedestal 341 may be coupled to a ground termination. For example, the signal with the frequency range may be injected into the circuit that is coupled to the second electrode 306. The second electrode may also be coupled to an RF ground termination.

In order to shield the DC voltage sources and/or the power source 367, the processing chamber 300 may include filter circuits represented in FIG. 3. These circuits may be configured to pass the DC chucking voltage to the pedestal 341, while shielding the DC voltage sources from particular RF frequencies used to drive the plasma in the processing region above the substrate 302.

Figure 4:
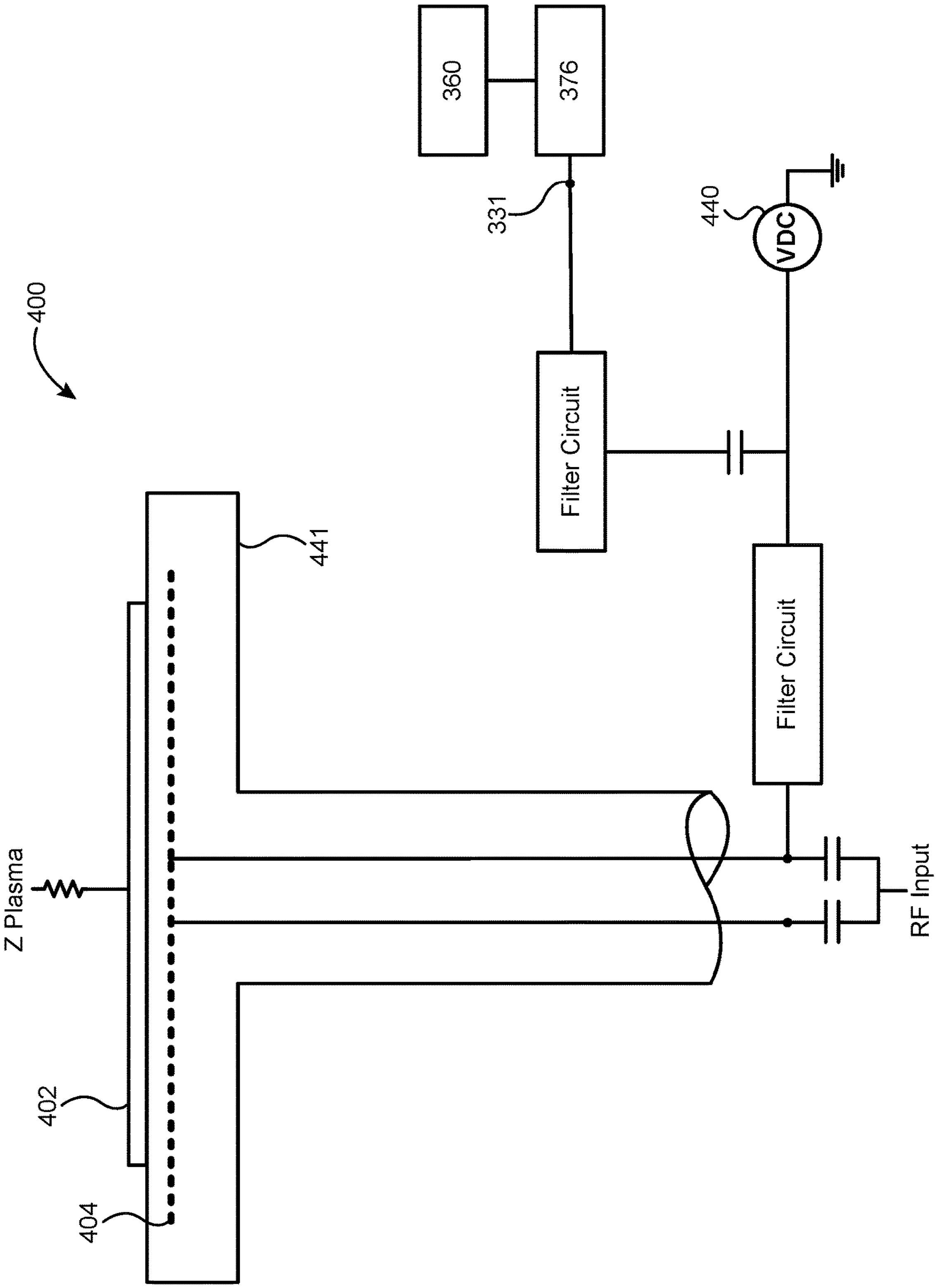
FIG. 4 illustrates a processing chamber with a monopolar ESC in a bottom-drive configuration, according to some embodiments.

FIG. 4 illustrates a processing chamber 400 with a monopolar ESC in a bottom-drive configuration, according to some embodiments. In a monopolar ESC, the one or more electrodes in the pedestal 441 may include a single electrode 404. A high-voltage DC power supply 440 may provide a DC chucking voltage to the single electrode 404. When a plasma is present in the processing region above the substrate 402, a charge may form on the substrate 402 that is the opposite of the charge on the single electrode 404. The attractive force between the charge buildup may clamp the substrate 402 to the pedestal 441.

As was the case with the bipolar ESC, the power source 376 may inject signal having the frequency range into the DC chucking input to the single electrode 404. This system for applying the signal with the frequency range and measuring the resulting impedance changes may be even more advantageous with a monopolar ESC. Since the monopolar ESC requires a plasma to be present in order for the ESC to operate, it is even more difficult to perform in situ determinations of the chucking state of the substrate 402. Note that the capacitances and subsequent impedance changes may be different when using a monopolar ESC compared to a bipolar ESC. However these different capacitances and the resulting impedance values can be used to determine the chucking state as described in detail below.

Figure 5:
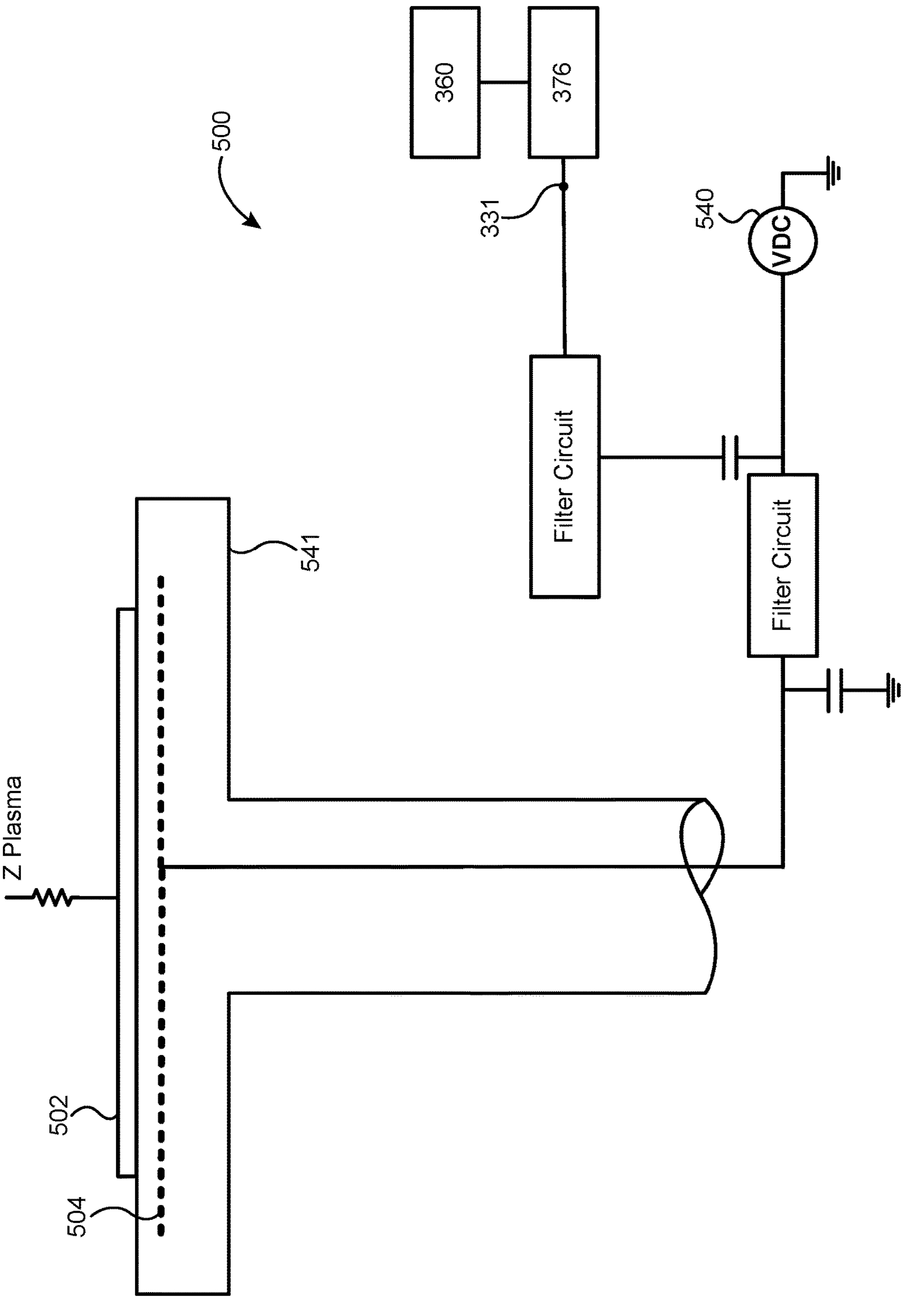
FIG. 5 illustrates a processing chamber with a monopolar ESC in a top-drive configuration, according to some embodiments.

FIG. 5 illustrates a processing chamber 500 with a monopolar ESC in a top-drive configuration, according to some embodiments. The top-drive configuration may operate in substantially the same way as described above for the bottom-drive configuration. The power source 376 may continue to inject the signal with a frequency range into electrode 504 in the pedestal 541 used by the DC chucking voltage source 540 to clamp the substrate 502.

The method 200 may additionally include determining a chucking state of the substrate relative to the pedestal during the semiconductor process based at least in part on the impedance (208). The chucking state of the substrate may be determined by observing changes in the measured impedance in response to changes in the applied chucking voltage from the DC chucking power sources. In some embodiments, determining the chucking state of the substrate relative to the pedestal may also include determining a bow or bow shape of the substrate.

Figure 6:
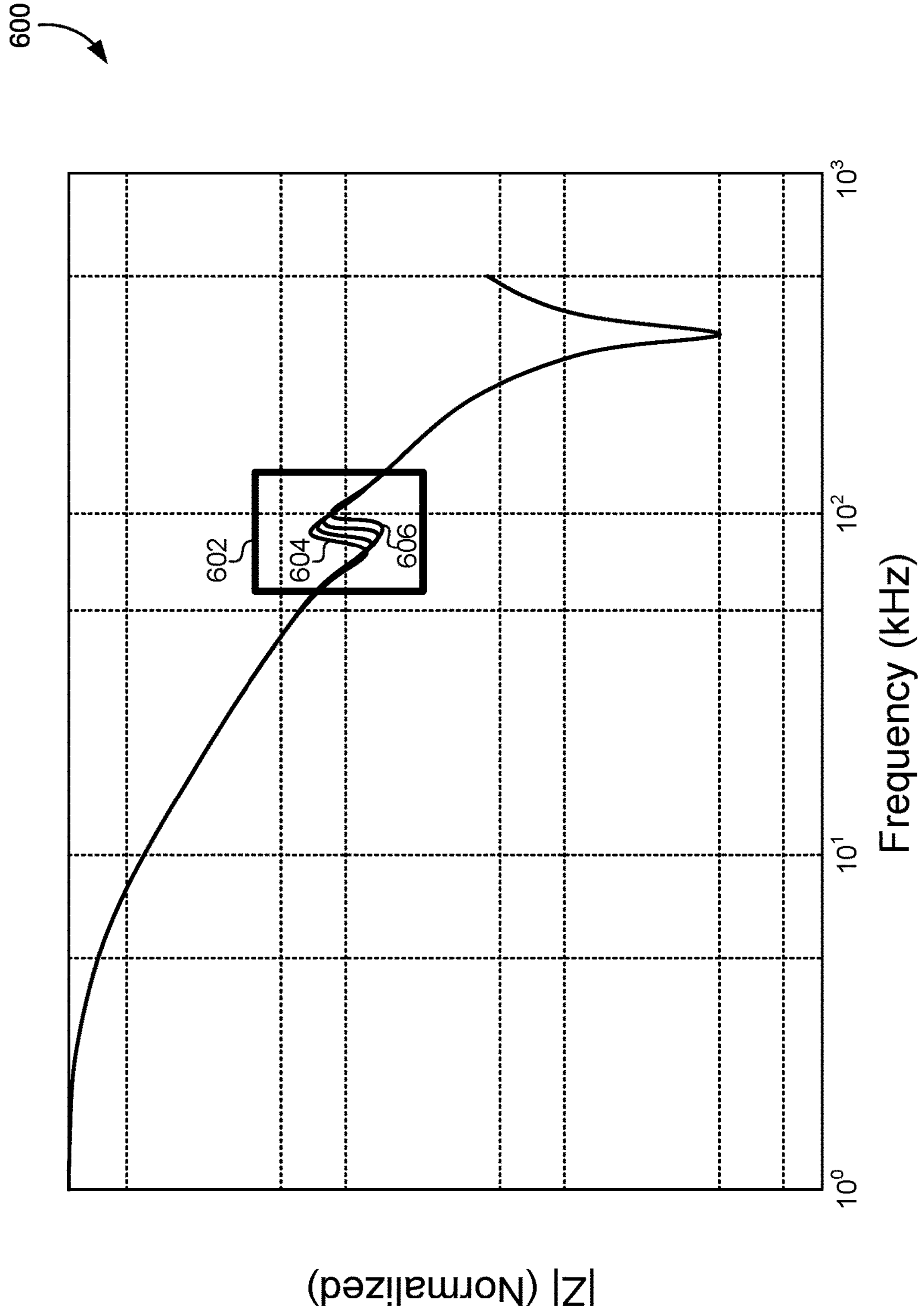
FIG. 6 illustrates a graph showing various impedance measurements made in response to a signal being applied with a frequency range, according to some embodiments.

FIG. 6 illustrates a graph 600 showing various impedance measurements made in response to a signal being applied with a frequency range, according to some embodiments. The graph 600 includes multiple iterations of the signal with the frequency range being applied to one of the ESC electrodes in the pedestal. For example, during one iteration, the signal may begin at about 1 kHz and be gradually ramped up to about 1 MHz or any of the other frequency ranges described above. The frequency range may be represented by the horizontal axis of the graph 600. The sweep of the frequency range may include discrete increments or steps of, for example, 1 kHz, 5 kHz, 10 kHz, 25 kHz, 50 kHz, and/or other incremental steps. In some embodiments, the discrete increments may be increased on a logarithmic scale as illustrated in FIG. 6. Each iteration of sweeping the frequency between a first/minimum frequency to a second/maximum frequency may have a duration of less than about 1 second, less than about 5 seconds, less than about 10 seconds, less than about 20 seconds, less than about 30 seconds, or less than about 60 seconds.

As described above, at each frequency step, or at regular time intervals during the frequency suite, an impedance measurement may be made at the input to the ESC where the signal is injected. Some embodiments may use a real portion of the complex impedance value, while other embodiments may instead use an imaginary portion of the complex impedance value. Some embodiments may use an absolute value or magnitude of the complex impedance value as illustrated in the graph 600. Considering both portions of a complex impedance or the magnitude of the complex impedance may be advantageous since the real and imaginary portions of the impedance may shift more or less relative to each other depending on the frequency.

Multiple iterations of the sweep through the frequency range may be conducted before, during, and/or after the semiconductor process. For example, these iterations may be continuous, such that when a maximum frequency is reached, the next iteration begins again by increasing from the minimum frequency. In some cases, the chucking voltage may remain constant during multiple iterations to monitor the chucking state of the substrate. In other cases, the chucking voltage may be adjusted for each iteration to observe how the changing chucking voltage will affect the chucking state of the substrate. The graph 600 illustrates multiple iterations, with each curve representing a different iteration at a different chucking voltage.

As described above, each processing chamber, semiconductor process, and/or substrate may have different characteristics that affect the impedance measurements throughout the frequency range. Therefore, the embodiments described herein may learn or identify the impedance measurements that correspond to different chucking states of the substrate for each individual process. For example, an impedance measurement may be received when the substrate is not present on the pedestal. This impedance measurement may be indicative of an un-chucked substrate. The impedance measurement may include a single impedance measurement or a curve of impedance measurements throughout the frequency range as depicted in FIG. 6. Additionally, an impedance measurement may be received where the substrate is fully chucked to the pedestal. For example, a substrate may be placed on the pedestal and a large chucking voltage known to be sufficient to fully chuck the substrate may be applied. The signal with a frequency range may be applied and a representative curve indicative of a fully-chucked substrate may be stored. In the example of FIG. 6, the graph 600 includes a curve 604 that may be representative of an fully chucked substrate, and a curve 606 indicative of an un-chucked substrate.

These curves may then be used to incrementally adjust the chucking voltage until it is optimal and holds the substrate against the pedestal with just enough force to secure the substrate, but without enough force to damage the substrate. For example, some embodiments may start at a relatively low chucking voltage and increase until the impedance measurements indicate that the substrate is fully chucked. A low chucking voltage may be applied, and the controller may gradually ramp up the DC chucking voltage until the impedance indicates that the substrate is fully chucked to the pedestal. Alternatively, some embodiments may start at a relatively high chucking voltage and decrease until the impedance measurements indicate that the substrate is becoming un-chucked, then slightly increase the chucking voltage to fully re-chuck the substrate. More specifically, after applying a high chucking voltage that is known to fully chuck the substrate, the controller may gradually ramp down the DC chucking voltage until the impedance indicates that the substrate is not fully chucked to the pedestal. This may correspond to a shift in the impedance curve measured through a sweep through the frequency range. The process may then incrementally increase the DC chucking voltage until the impedance again indicates that the substrate is fully chucked to the pedestal.

Some portions of the frequency range may correspond to greater shifts in the impedance that may be more readily identified than at other portions of the frequency range. For example, it has been discovered that a resonant frequency often corresponds to the largest shifts in the impedance based on the chucking state of the substrate. Therefore, some embodiments may focus the analysis on a resonant range 602 around a resonant frequency to identify shifts in the impedance values. Note that the resonant range 602 depicted in FIG. 6 is provided only by way of example, and this frequency range is not meant to be limiting. The actual frequencies included in the resonant range 602 may vary for every chamber, application, and/or operating environment. Therefore, this resonant range 602 should be identified individually for each implementation.

Figure 7:
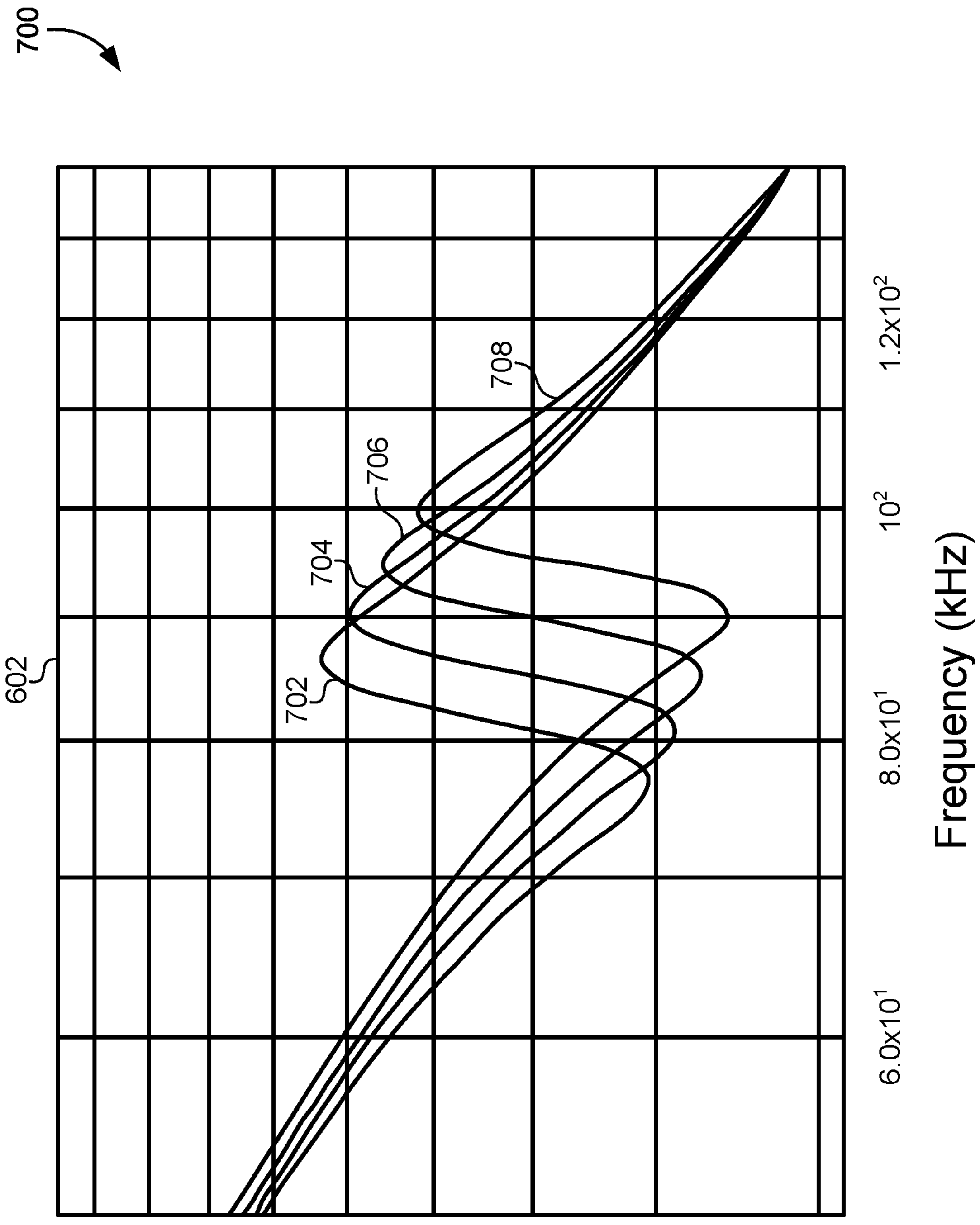
FIG. 7 illustrates a detailed view of the resonant range, according to some embodiments.

FIG. 7 illustrates a detailed view of the resonant range 602, according to some embodiments. The resonant range 602 may be centered around a resonant frequency. The resonant range 602 may change with different substrates and/or processing chambers. Therefore, the controller may be configured to identify a resonant range 602 in the impedance curves corresponding to a sweep through the frequency range. For example, the resonant range 602 may be located by identifying a local minimum and a local maximum observed in the measurements of the impedance as illustrated in FIG. 7.

Some embodiments may optimize the sweep through the frequency range by measuring a change in the impedance values specifically within the resonant range rather than making comparisons between impedance values throughout the entire impedance measurement. For example, the difference in impedance between a chucked substrate and an un-chucked substrate may differ by between about 15% to about 20% within the resonant range 602. In contrast, the difference in impedance between the two states may only differ by between about 1% and about 3% outside of the resonant range 602. Therefore, by focusing on the resonant range 602, the shifts in impedance due to the chucking state of the substrate may be more accurately identified.

Within the resonant range 602, some embodiments may reduce the frequency range with each sweep to cover the frequencies within the resonant range (e.g., about 60 kHz to about 120 kHz) rather than through the entire frequency range (e.g. about 1 kHz to about 1 MHz). This may reduce the time required for each frequency sweep and thereby improve the responsiveness of the system to changes in the chucking state. Some embodiments may even identify a single frequency in the resonant range 602, such as a resonant frequency. The single frequency may be applied to the electrode instead of sweeping frequencies throughout the resonant range or the entire frequency range. For example, a midpoint frequency between the local minimum and the local maximum of the resonant range 602 may be selected and applied continuously while the chucking voltage is adjusted.

As described above, this process may be used to initially determine and apply an optimal chucking voltage to the substrate. For example, a voltage sufficient to over-chuck the substrate may be applied, resulting in curve 702 that is indicative of a fully-chucked substrate. The chucking voltage may then be gradually reduced by increments of 5 V, 10 V, 20 V, and so forth. Once the chucking voltage is reduced enough to begin to allow the substrate to separate from the pedestal, the curve 702 may begin to shift. For example, the controller may detect when the impedance measurements shift to curve 704 to identify that the chucking voltage is falling below the optimal level. The controller may then incrementally increase the voltage until the impedance shifts back to curve 702.

Alternatively, a low chucking voltage may be applied, resulting in curve 708 that is indicative of an un-chucked substrate. The chucking voltage may then be incrementally increased, and a sweep through the frequency range may be applied at each voltage increment. The impedance measurements may gradually move from curve 708 to curve 706, to curve 704, and so forth, as the chucking voltage increases. When the impedance measurements are aligned with curve 702, the optimal chucking voltage may be identified. Note that curve 702 and curve 708 may be identified as indicating a fully-chucked substrate and an un-chucked substrate using the techniques described above.

After the optimal chucking voltage has been identified, the system may continue to apply the signal with the frequency range to monitor the chucking state of the substrate during the semiconductor process. If the chucking state stays constant, then the measured impedance should also stay fairly constant. Therefore, if changes in the impedance are detected, the controller may determine that the chucking state of the wafer is changing. This may be used to generate an alert to a user, to increase or decrease the chucking voltage dynamically during the process, or to flag the substrate for further inspection after the process is complete.

In addition to simply determining the chucking state, some embodiments may also determine a bow or bow shape of the substrate. If the chucking state of the wafer indicates that the wafer is not fully chucked to the pedestal, the shape and/or location of the curves illustrated in FIG. 7 may also indicate a type of bow present in the substrate. For example, different types of bow shapes (e.g., convex, concave, "potato chip," etc.) may be identified and collated with specific curve locations and/or curve shapes for a particular chamber or process. The chucked measurement process may then be performed on subsequent wafers on the pedestal, and the resulting curves may then be matched with known patterns to identify a bow shape.

It should be appreciated that the specific steps illustrated in FIG. 2 provide particular methods of determining a chucking state of a substrate according to various embodiments. Other sequences of steps may also be performed according to alternative embodiments. For example, alternative embodiments may perform the steps outlined above in a different order. Moreover, the individual steps illustrated in FIG. 2 may include multiple sub-steps that may be performed in various sequences as appropriate to the individual step. Furthermore, additional steps may be added or removed depending on the particular applications. Many variations, modifications, and alternatives also fall within the scope of this disclosure.

Figure 8:
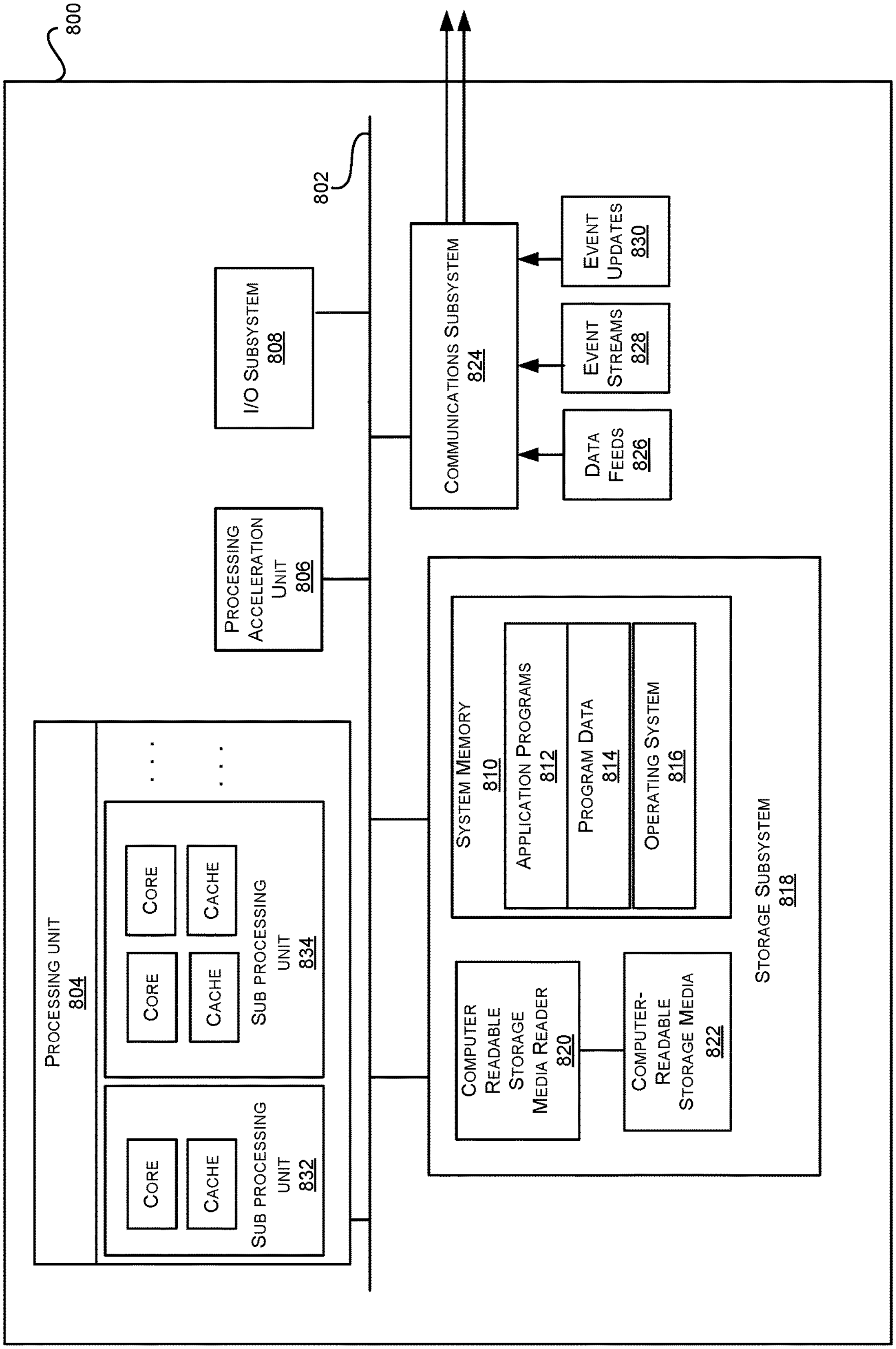
FIG. 8 illustrates an exemplary computer system, in which various embodiments may be implemented.

FIG. 8 illustrates an exemplary computer system 800, in which various embodiments may be implemented. The system 800 may be used to implement any of the computer systems or controllers described above. As shown in the figure, computer system 800 includes a processing unit 804 that communicates with a number of peripheral subsystems via a bus subsystem 802. These peripheral subsystems may include a processing acceleration unit 806, an I/O subsystem 808, a storage subsystem 818 and a communications subsystem 824. Storage subsystem 818 includes tangible computer-readable storage media 822 and a system memory 810.

Bus subsystem 802 provides a mechanism for letting the various components and subsystems of computer system 800 communicate with each other as intended. Although bus subsystem 802 is shown schematically as a single bus, alternative embodiments of the bus subsystem may utilize multiple buses. Bus subsystem 802 may be any of several types of bus structures including a memory bus or memory controller, a peripheral bus, and a local bus using any of a variety of bus architectures. For example, such architectures may include an Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus, which can be implemented as a Mezzanine bus manufactured to the IEEE P1386.1 standard.

Processing unit 804, which can be implemented as one or more integrated circuits (e.g., a conventional microprocessor or microcontroller), controls the operation of computer system 800. One or more processors may be included in processing unit 804. These processors may include single core or multicore processors. In certain embodiments, processing unit 804 may be implemented as one or more independent processing units 832 and/or 834 with single or multicore processors included in each processing unit. In other embodiments, processing unit 804 may also be implemented as a quad-core processing unit formed by integrating two dual-core processors into a single chip.

In various embodiments, processing unit 804 can execute a variety of programs in response to program code and can maintain multiple concurrently executing programs or processes. At any given time, some or all of the program code to be executed can be resident in processor(s) 804 and/or in storage subsystem 818. Through suitable programming, processor(s) 804 can provide various functionalities described above. Computer system 800 may additionally include a processing acceleration unit 806, which can include a digital signal processor (DSP), a special-purpose processor, and/or the like.

I/O subsystem 808 may include user interface input devices and user interface output devices. User interface input devices may include a keyboard, pointing devices such as a mouse or trackball, a touchpad or touch screen incorporated into a display, a scroll wheel, a click wheel, a dial, a button, a switch, a keypad, audio input devices with voice command recognition systems, microphones, and other types of input devices. Additionally, user interface input devices may include voice recognition sensing devices that enable users to interact with voice recognition systems through voice commands.

User interface input devices may also include, without limitation, three dimensional (3D) mice, joysticks or pointing sticks, gamepads and graphic tablets, and audio/visual devices such as speakers, digital cameras, digital video cameras, portable media players, webcams, image scanners, fingerprint scanners, barcode reader 3D scanners, 3D printers, laser rangefinders, and eye gaze tracking devices.

User interface output devices may include a display subsystem, indicator lights, or non-visual displays such as audio output devices, etc. The display subsystem may be a cathode ray tube (CRT), a flat-panel device, such as that using a liquid crystal display (LCD) or plasma display, a projection device, a touch screen, and the like. In general, use of the term "output device" is intended to include all possible types of devices and mechanisms for outputting information from computer system 800 to a user or other computer. For example, user interface output devices may include, without limitation, a variety of display devices that visually convey text, graphics and audio/video information such as monitors, printers, speakers, headphones, automotive navigation systems, plotters, voice output devices, and modems.

Computer system 800 may comprise a storage subsystem 818 that comprises software elements, shown as being currently located within a system memory 810. System memory 810 may store program instructions that are loadable and executable on processing unit 804, as well as data generated during the execution of these programs.

Depending on the configuration and type of computer system 800, system memory 810 may be volatile (such as random access memory (RAM)) and/or non-volatile (such as read-only memory (ROM), flash memory, etc.) The RAM typically contains data and/or program modules that are immediately accessible to and/or presently being operated and executed by processing unit 804. In some implementations, system memory 810 may include multiple different types of memory, such as static random access memory (SRAM) or dynamic random access memory (DRAM). In some implementations, a basic input/output system (BIOS), containing the basic routines that help to transfer information between elements within computer system 800, such as during start-up, may typically be stored in the ROM. By way of example, and not limitation, system memory 810 also illustrates application programs 812, which may include client applications, Web browsers, mid-tier applications, relational database management systems (RDBMS), etc., program data 814, and an operating system 816.

Storage subsystem 818 may also provide a tangible computer-readable storage medium for storing the basic programming and data constructs that provide the functionality of some embodiments. Software (programs, code modules, instructions) that when executed by a processor provide the functionality described above may be stored in storage subsystem 818. These software modules or instructions may be executed by processing unit 804. Storage subsystem 818 may also provide a repository for storing data used in accordance with some embodiments.

Storage subsystem 800 may also include a computer-readable storage media reader 820 that can further be connected to computer-readable storage media 822. Together and, optionally, in combination with system memory 810, computer-readable storage media 822 may comprehensively represent remote, local, fixed, and/or removable storage devices plus storage media for temporarily and/or more permanently containing, storing, transmitting, and retrieving computer-readable information.

Computer-readable storage media 822 containing code, or portions of code, can also include any appropriate media, including storage media and communication media, such as but not limited to, volatile and non-volatile, removable and non-removable media implemented in any method or technology for storage and/or transmission of information. This can include tangible computer-readable storage media such as RAM, ROM, electronically erasable programmable ROM (EEPROM), flash memory or other memory technology, CD-ROM, digital versatile disk (DVD), or other optical storage, magnetic cassettes, magnetic tape, magnetic disk storage or other magnetic storage devices, or other tangible computer readable media. This can also include nontangible computer-readable media, such as data signals, data transmissions, or any other medium which can be used to transmit the desired information and which can be accessed by computing system 800.

By way of example, computer-readable storage media 822 may include a hard disk drive that reads from or writes to non-removable, nonvolatile magnetic media, a magnetic disk drive that reads from or writes to a removable, nonvolatile magnetic disk, and an optical disk drive that reads from or writes to a removable, nonvolatile optical disk such as a CD ROM, DVD, or other optical media. Computer-readable storage media 822 may include, but is not limited to, flash memory cards, universal serial bus (USB) flash drives, secure digital (SD) cards, DVD disks, digital video tape, and the like. Computer-readable storage media 822 may also include, solid-state drives (SSD) based on non-volatile memory such as flash-memory based SSDs, enterprise flash drives, solid state ROM, and the like, SSDs based on volatile memory such as solid state RAM, dynamic RAM, static RAM, DRAM-based SSDs, magnetoresistive RAM (MRAM) SSDs, and hybrid SSDs that use a combination of DRAM and flash memory based SSDs. The disk drives and their associated computer-readable media may provide non-volatile storage of computer-readable instructions, data structures, program modules, and other data for computer system 800.

Communications subsystem 824 provides an interface to other computer systems and networks. Communications subsystem 824 serves as an interface for receiving data from and transmitting data to other systems from computer system 800. For example, communications subsystem 824 may enable computer system 800 to connect to one or more devices via the Internet. In some embodiments communications subsystem 824 can include radio frequency (RF) transceiver components for accessing wireless voice and/or data networks (e.g., using cellular telephone technology, advanced data network technology, such as 3G, 4G or EDGE (enhanced data rates for global evolution), WiFi (IEEE 802.11 family standards, or other mobile communication technologies, or any combination thereof), global positioning system (GPS) receiver components, and/or other components. In some embodiments communications subsystem 824 can provide wired network connectivity (e.g., Ethernet) in addition to or instead of a wireless interface.

In some embodiments, communications subsystem 824 may also receive input communication in the form of structured and/or unstructured data feeds 826, event streams 828, event updates 830, and the like on behalf of one or more users who may use computer system 800.

Additionally, communications subsystem 824 may also be configured to receive data in the form of continuous data streams, which may include event streams 828 of real-time events and/or event updates 830, that may be continuous or unbounded in nature with no explicit end. Examples of applications that generate continuous data may include, for example, sensor data applications, financial tickers, network performance measuring tools (e.g. network monitoring and traffic management applications), clickstream analysis tools, automobile traffic monitoring, and the like.

Communications subsystem 824 may also be configured to output the structured and/or unstructured data feeds 826, event streams 828, event updates 830, and the like to one or more databases that may be in communication with one or more streaming data source computers coupled to computer system 800.

Computer system 800 can be one of various types, including a handheld portable device (e.g., a smart phone, an computing tablet, a PDA), a wearable device (e.g., a smart watch), a PC, a workstation, a mainframe, a kiosk, a server rack, or any other data processing system.

Due to the ever-changing nature of computers and networks, the description of computer system 800 depicted in the figure is intended only as a specific example. Many other configurations having more or fewer components than the system depicted in the figure are possible. For example, customized hardware might also be used and/or particular elements might be implemented in hardware, firmware, software (including applets), or a combination. Further, connection to other computing devices, such as network input/output devices, may be employed. Based on the disclosure and teachings provided herein, other ways and/or methods to implement the various embodiments should be apparent.

As used herein, the terms "about" or "approximately" or "substantially" may be interpreted as being within a range that would be expected by one having ordinary skill in the art in light of the specification.

In the foregoing description, for the purposes of explanation, numerous specific details were set forth in order to provide a thorough understanding of various embodiments. It will be apparent, however, that some embodiments may be practiced without some of these specific details. In other instances, well-known structures and devices are shown in block diagram form.

The foregoing description provides exemplary embodiments only, and is not intended to limit the scope, applicability, or configuration of the disclosure. Rather, the foregoing description of various embodiments will provide an enabling disclosure for implementing at least one embodiment. It should be understood that various changes may be made in the function and arrangement of elements without departing from the spirit and scope of some embodiments as set forth in the appended claims.

Specific details are given in the foregoing description to provide a thorough understanding of the embodiments. However, it will be understood that the embodiments may be practiced without these specific details. For example, circuits, systems, networks, processes, and other components may have been shown as components in block diagram form in order not to obscure the embodiments in unnecessary detail. In other instances, well-known circuits, processes, algorithms, structures, and techniques may have been shown without unnecessary detail in order to avoid obscuring the embodiments.

Also, it is noted that individual embodiments may have been described as a process which is depicted as a flowchart, a flow diagram, a data flow diagram, a structure diagram, or a block diagram. Although a flowchart may have described the operations as a sequential process, many of the operations can be performed in parallel or concurrently. In addition, the order of the operations may be re-arranged. A process is terminated when its operations are completed, but could have additional steps not included in a figure. A process may correspond to a method, a function, a procedure, a subroutine, a subprogram, etc. When a process corresponds to a function, its termination can correspond to a return of the function to the calling function or the main function.

The term "computer-readable medium" includes, but is not limited to portable or fixed storage devices, optical storage devices, wireless channels and various other mediums capable of storing, containing, or carrying instruction(s) and/or data. A code segment or machine-executable instructions may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc., may be passed, forwarded, or transmitted via any suitable means including memory sharing, message passing, token passing, network transmission, etc.

Furthermore, embodiments may be implemented by hardware, software, firmware, middleware, microcode, hardware description languages, or any combination thereof. When implemented in software, firmware, middleware or microcode, the program code or code segments to perform the necessary tasks may be stored in a machine readable medium. A processor(s) may perform the necessary tasks.

In the foregoing specification, features are described with reference to specific embodiments thereof, but it should be recognized that not all embodiments are limited thereto. Various features and aspects of some embodiments may be used individually or jointly. Further, embodiments can be utilized in any number of environments and applications beyond those described herein without departing from the broader spirit and scope of the specification. The specification and drawings are, accordingly, to be regarded as illustrative rather than restrictive.

Additionally, for the purposes of illustration, methods were described in a particular order. It should be appreciated that in alternate embodiments, the methods may be performed in a different order than that described. It should also be appreciated that the methods described above may be performed by hardware components or may be embodied in sequences of machine-executable instructions, which may be used to cause a machine, such as a general-purpose or special-purpose processor or logic circuits programmed with the instructions to perform the methods. These machine-executable instructions may be stored on one or more machine readable mediums, such as CD-ROMs or other type of optical disks, floppy diskettes, ROMs, RAMs, EPROMs, EEPROMs, magnetic or optical cards, flash memory, or other types of machine-readable mediums suitable for storing electronic instructions. Alternatively, the methods may be performed by a combination of hardware and software.

What is claimed is:

1. A semiconductor processing chamber comprising:

a pedestal configured to support a substrate during a semiconductor process;

an electrostatic chuck (ESC) comprising one or more electrodes embedded in the pedestal, wherein the one or more electrodes are configured to deliver a chucking voltage to the pedestal during the semiconductor process;

a power source coupled to an electrode in the one or more electrodes, wherein the power source is configured to provide a signal that sweeps through a frequency range to the electrode during the semiconductor process; and a controller configured to receive a measurement of an impedance when the signal that sweeps through the frequency range is applied to the electrode at a resonant frequency, and determine whether an airgap is present between the substrate and the pedestal during the semiconductor process based at least in part on the impedance.

2. The semiconductor processing chamber of claim 1, wherein the impedance comprises an input impedance measured between an output of the power source and a ground.

3. The semiconductor processing chamber of claim 2, wherein the power source further comprises a measurement circuit configured to measure the input impedance.

4. The semiconductor processing chamber of claim 1, wherein the one or more electrodes comprises a single electrode for a monopolar ESC.

5. The semiconductor processing chamber of claim 1, further comprising a filter on an output of the power source, wherein the filter is configured to filter a radio-frequency (RF) signal provided to a plasma in the semiconductor processing chamber during the semiconductor process.

6. The semiconductor processing chamber of claim 1, wherein the one or more electrodes comprises two electrodes for a bipolar ESC.

7. The semiconductor processing chamber of claim 6, wherein the bipolar ESC comprises a top-feed bipolar ESC, and the electrode in the pedestal is coupled to ground.

8. The semiconductor processing chamber of claim 6, wherein the bipolar ESC comprises a bottom-feed bipolar ESC, and the electrode in the pedestal is coupled to an RF power supply configured to provide an RF signal to the electrode during the semiconductor process.

9. A method of monitoring substrate chucking during semiconductor processes, the method comprising:

applying a direct-current (DC) chucking voltage to one or more electrodes embedded in a pedestal that is configured to support a substrate during a semiconductor process;

applying a signal to an electrode in the one or more electrodes during the semiconductor process, wherein the signal sweeps through a frequency range;

measuring an impedance when the signal that sweeps through the frequency range is applied to the electrode at a resonant frequency; and determining a chucking state of the substrate relative to the pedestal during the semiconductor process based at least in part on the impedance.

10. The method of claim 9, wherein applying the signal having the frequency range comprises applying an alternating-current (AC) signal that sweeps the frequency range between a first frequency and a second frequency, wherein the first frequency is less than the second frequency.

11. The method of claim 9, wherein determining the chucking state of the substrate further includes determining a bow shape of the substrate based at least in part on the impedance.

12. The method of claim 9, wherein the impedance being less than a first impedance indicates that the substrate is not fully chucked, and the impedance being greater than a second impedance indicates that the substrate is fully chucked.

13. One or more non-transitory computer-readable media comprising instructions that, when executed by one or more processors, cause the one or more processors to perform operations comprising:

causing a direct-current (DC) chucking voltage to be applied to one or more electrodes embedded in a pedestal that is configured to support a substrate during a semiconductor process;

causing a signal to be applied to an electrode in the one or more electrodes during the semiconductor process, wherein the signal sweeps through a frequency range;

receiving a measurement of an impedance when the signal that sweeps through the frequency range is applied to the electrode at a resonant frequency; and determining a chucking state of the substrate relative to the pedestal during the semiconductor process based at least in part on the impedance.

14. The one or more non-transitory computer-readable media of claim 13, wherein the operations further comprise identifying a resonant range in the frequency range, wherein the resonant range is between a local minimum and a local maximum observed in the measurement of the impedance.

15. The one or more non-transitory computer-readable media of claim 14, wherein after identifying the resonant range, causing the signal to be applied to the electrode by sweeping frequencies within the resonant range.

16. The one or more non-transitory computer-readable media of claim 14, wherein after identifying the resonant frequency in the resonant range, and then causing the signal to be applied to the electrode at the resonant frequency instead of sweeping frequencies throughout the resonant range.

17. The one or more non-transitory computer-readable media of claim 13, wherein the operations further comprise:

determining an impedance that indicates a fully chucked substrate by applying a sufficient chucking voltage to the electrode when the substrate is on the pedestal and measuring the impedance; and determining an impedance that indicates an un-chucked substrate measuring the impedance when the substrate is not on the pedestal.

18. The one or more non-transitory computer-readable media of claim 13, wherein the operations further comprise:

gradually ramping up the DC chucking voltage until the impedance indicates that the substrate is fully chucked to the pedestal.

19. The one or more non-transitory computer-readable media of claim 13, wherein the operations further comprise:

gradually ramping down the DC chucking voltage until the impedance indicates that the substrate is not fully chucked to the pedestal.

20. The one or more non-transitory computer-readable media of claim 19, wherein the operations further comprise:

incrementally increasing the DC chucking voltage until the impedance again indicates that the substrate is fully chucked to the pedestal.

* * * * *